(12) United States Patent
Fee et al.

(10) Patent No.: US 6,876,066 B2
(45) Date of Patent: Apr. 5, 2005

(54) PACKAGED MICROELECTRONIC DEVICES AND METHODS OF FORMING SAME

(75) Inventors: Setho Sing Fee, Singapore (SG); Lim Thiam Chye, Singapore (SG); Eric Tan Swee Seng, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/944,246

(22) Filed: Aug. 30, 2001

(65) Prior Publication Data

US 2003/0042581 A1 Mar. 6, 2003

(30) Foreign Application Priority Data

Aug. 29, 2001 (SG) .................................... 2001005297-6

(51) Int. Cl.[7] ............................................. H01L 23/495
(52) U.S. Cl. ..................... 257/666; 257/667; 257/678; 257/686; 257/773; 257/777; 438/123
(58) Field of Search ................................ 257/666, 667, 257/678, 686, 773, 777; 438/123

(56) References Cited

U.S. PATENT DOCUMENTS

| | | |
|---|---|---|
| 4,012,579 A | 3/1977 | Fox et al. |
| 4,862,245 A | 8/1989 | Pashby et al. |
| 5,107,328 A | 4/1992 | Kinsman |
| 5,128,831 A | 7/1992 | Fox, III et al. |
| 5,138,434 A | 8/1992 | Wood et al. |
| 5,140,404 A | 8/1992 | Fogal et al. |
| 5,252,853 A | 10/1993 | Michii |
| 5,252,857 A | 10/1993 | Kane et al. |
| 5,304,842 A | 4/1994 | Farnworth et al. |
| 5,471,369 A | 11/1995 | Honda et al. |
| 5,475,918 A | 12/1995 | Kubota et al. |
| 5,518,957 A | 5/1996 | Kim |
| 5,536,969 A | 7/1996 | Matsuoka |
| 5,583,371 A | 12/1996 | Hori |
| 5,593,927 A | 1/1997 | Farnworth et al. |
| 5,663,593 A | 9/1997 | Mostafazadeh et al. |
| 5,665,651 A * | 9/1997 | Asada et al. .................. 29/827 |
| 5,677,566 A | 10/1997 | King et al. |
| 5,696,033 A | 12/1997 | Kinsman |
| 5,715,593 A | 2/1998 | Kimura |
| 5,729,049 A | 3/1998 | Corisis et al. |
| 5,739,585 A | 4/1998 | Akram et al. |
| 5,744,827 A | 4/1998 | Jeong et al. |

(Continued)

FOREIGN PATENT DOCUMENTS

SG        200104675-4        8/2001

OTHER PUBLICATIONS

U.S. Appl. No. 10/651,913, Seng et al., filed Aug. 29, 2003.
Ishino, Toshiaki, Silicone Adhesive Tape, Nitto Technical Report, vol. 38, No. 2, pp. 49–50, Dec. 2000, <http://www.nitto.com/rd/2000_2/15ishinoe.qxp.pdf>.

(Continued)

*Primary Examiner*—David Nelms
*Assistant Examiner*—Tu-Tu Ho
(74) *Attorney, Agent, or Firm*—Perkins Coie LLP

(57) ABSTRACT

Microelectronic devices in accordance with aspects of the invention may include a die, a plurality of lead fingers and an encapsulant which may bond the lead fingers and the die. In one method of the invention, a lead frame and a die are releasably attached to a support, an encapsulant is applied, and the support can be removed to expose back contacts of the lead fingers and a back surface of the die. One microelectronic device assembly of the invention includes a die having an exposed back die surface; a plurality of electrical leads, each of which includes front and back electrical contacts; bonding wires electrically coupling the die to the electrical leads; and an encapsulant bonded to the die and the electrical leads. The rear electrical contacts of the electrical leads may be exposed adjacent a back surface of the encapsulant in a staggered array.

31 Claims, 9 Drawing Sheets

U.S. PATENT DOCUMENTS

| | | |
|---|---|---|
| D394,844 S | 6/1998 | Farnworth |
| 5,815,000 A | 9/1998 | Farnworth et al. |
| D402,638 S | 12/1998 | Farnworth |
| 5,847,455 A | 12/1998 | Manteghi |
| 5,851,845 A | 12/1998 | Wood et al. |
| 5,866,939 A | 2/1999 | Shin et al. |
| 5,866,953 A | 2/1999 | Akram et al. |
| 5,879,965 A | 3/1999 | Jiang et al. |
| 5,883,426 A | 3/1999 | Tokuno et al. |
| 5,891,753 A | 4/1999 | Akram |
| 5,891,797 A | 4/1999 | Farrar |
| 5,893,726 A | 4/1999 | Farnworth et al. |
| 5,898,224 A | 4/1999 | Akram |
| 5,933,713 A | 8/1999 | Farnworth |
| 5,938,956 A | 8/1999 | Hembree et al. |
| 5,946,553 A | 8/1999 | Wood et al. |
| 5,956,236 A | 9/1999 | Corisis et al. |
| 5,958,100 A | 9/1999 | Farnworth et al. |
| 5,973,393 A | 10/1999 | Chia et al. |
| 5,973,396 A | 10/1999 | Farnworth |
| 5,986,209 A | 11/1999 | Tandy |
| 5,989,941 A | 11/1999 | Wensel |
| 5,990,566 A | 11/1999 | Farnworth et al. |
| 5,994,784 A | 11/1999 | Ahmad |
| RE36,469 E | 12/1999 | Wood et al. |
| 6,008,070 A | 12/1999 | Farnworth |
| 6,020,624 A | 2/2000 | Wood et al. |
| 6,020,629 A | 2/2000 | Farnworth et al. |
| 6,025,728 A | 2/2000 | Hembree et al. |
| 6,028,356 A | 2/2000 | Kimura |
| 6,028,365 A | 2/2000 | Akram et al. |
| 6,046,496 A | 4/2000 | Corisis et al. |
| 6,048,744 A | 4/2000 | Corisis et al. |
| 6,048,755 A | 4/2000 | Jiang et al. |
| 6,049,125 A | 4/2000 | Brooks et al. |
| 6,051,878 A | 4/2000 | Akram et al. |
| 6,060,778 A | 5/2000 | Jeong et al. |
| 6,066,514 A | 5/2000 | King et al. |
| 6,072,233 A | 6/2000 | Corisis et al. |
| 6,072,236 A | 6/2000 | Akram et al. |
| 6,075,284 A | 6/2000 | Choi et al. |
| 6,075,288 A | 6/2000 | Akram |
| 6,089,920 A | 7/2000 | Farnworth et al. |
| 6,094,058 A | 7/2000 | Hembree et al. |
| 6,097,087 A | 8/2000 | Farnworth |
| 6,103,547 A | 8/2000 | Corisis et al. |
| 6,107,122 A | 8/2000 | Wood et al. |
| 6,107,680 A | 8/2000 | Hodges |
| 6,117,382 A | 9/2000 | Thummel |
| 6,117,710 A * | 9/2000 | Mostafazadeh et al. ...... 438/106 |
| 6,124,634 A | 9/2000 | Akram et al. |
| 6,133,068 A | 10/2000 | Kinsman |
| 6,137,162 A * | 10/2000 | Park et al. .................. 257/685 |
| 6,148,509 A | 11/2000 | Schoenfeld et al. |
| 6,150,710 A | 11/2000 | Corisis |
| 6,150,717 A | 11/2000 | Wood et al. |
| 6,153,924 A | 11/2000 | Kinsman |
| 6,159,764 A | 12/2000 | Kinsman et al. |
| 6,172,419 B1 | 1/2001 | Kinsman |
| 6,175,149 B1 | 1/2001 | Akram |
| 6,184,465 B1 | 2/2001 | Corisis |
| 6,198,172 B1 | 3/2001 | King et al. |
| 6,208,020 B1 | 3/2001 | Minamio et al. |
| 6,208,519 B1 | 3/2001 | Jiang et al. |
| 6,210,992 B1 | 4/2001 | Tandy et al. |
| 6,212,767 B1 | 4/2001 | Tandy |
| 6,215,175 B1 | 4/2001 | Kinsman |
| 6,215,177 B1 | 4/2001 | Corisis et al. |
| 6,225,689 B1 | 5/2001 | Moden et al. |
| 6,228,548 B1 | 5/2001 | King et al. |
| 6,228,687 B1 | 5/2001 | Akram et al. |
| 6,229,202 B1 | 5/2001 | Corisis |
| 6,232,229 B1 | 5/2001 | Reinberg |
| 6,235,554 B1 | 5/2001 | Akram et al. |
| 6,246,108 B1 | 6/2001 | Corisis et al. |
| 6,246,110 B1 | 6/2001 | Kinsman et al. |
| 6,258,623 B1 | 7/2001 | Moden et al. |
| 6,258,624 B1 | 7/2001 | Corisis |
| 6,259,153 B1 | 7/2001 | Corisis |
| 6,261,865 B1 | 7/2001 | Akram |
| 6,265,660 B1 | 7/2001 | Tandy |
| 6,277,671 B1 | 8/2001 | Tripard |
| 6,277,704 B1 | 8/2001 | Reinberg |
| 6,281,577 B1 | 8/2001 | Oppermann et al. |
| 6,284,571 B1 | 9/2001 | Corisis et al. |
| 6,291,894 B1 | 9/2001 | Farnworth et al. |
| 6,294,839 B1 | 9/2001 | Mess et al. |
| 6,297,543 B1 * | 10/2001 | Hong et al. .................. 257/666 |
| 6,297,547 B1 | 10/2001 | Akram |
| 6,303,469 B1 | 10/2001 | Larson et al. |
| 6,303,981 B1 | 10/2001 | Moden |
| 6,303,985 B1 | 10/2001 | Larson et al. |
| 6,310,390 B1 | 10/2001 | Moden |
| 6,314,639 B1 | 11/2001 | Corisis |
| 6,316,285 B1 | 11/2001 | Jiang et al. |
| 6,326,242 B1 | 12/2001 | Brooks et al. |
| 6,326,244 B1 | 12/2001 | Brooks et al. |
| 6,326,687 B1 | 12/2001 | Corisis |
| 6,326,697 B1 | 12/2001 | Farnworth |
| 6,326,698 B1 | 12/2001 | Akram |
| 6,329,220 B1 | 12/2001 | Bolken et al. |
| 6,329,705 B1 | 12/2001 | Ahmad |
| 6,331,221 B1 | 12/2001 | Cobbley |
| 6,331,448 B1 | 12/2001 | Ahmad |
| 6,331,453 B1 | 12/2001 | Bolken et al. |
| 6,332,766 B1 | 12/2001 | Thummel |
| 6,337,510 B1 | 1/2002 | Chun-Jen et al. |
| 6,339,254 B1 | 1/2002 | Venkateshwaran et al. |
| 6,344,976 B1 | 2/2002 | Schoenfeld et al. |
| 6,403,398 B2 * | 6/2002 | Ohuchi et al. ............. 438/111 |
| 6,429,528 B1 | 8/2002 | King et al. |
| 6,498,393 B2 * | 12/2002 | Fujimoto et al. ........... 257/692 |
| 6,501,184 B1 | 12/2002 | Shin et al. |
| 6,516,516 B1 * | 2/2003 | Lee .............................. 29/855 |
| 6,518,659 B1 * | 2/2003 | Glenn ....................... 257/704 |
| 6,576,494 B1 | 6/2003 | Farnworth |
| 6,630,729 B2 | 10/2003 | Huang |
| 2002/0027273 A1 * | 3/2002 | Huang |
| 2003/0001285 A1 | 1/2003 | Shin et al. |
| 2003/0104653 A1 | 6/2003 | Farnworth |
| 2003/0104654 A1 | 6/2003 | Farnworth |
| 2004/0026773 A1 | 2/2004 | Koon et al. |

OTHER PUBLICATIONS

Kuhnlein, Gerd, "A design and manufacturing solution for high reliable non–leaded CSP's like QFN," 2000 Electronics Packaging Technology Conference, pp. 169–175.

Tech Connect, QFN Leadframes, ASM Pacific Technology Ltd., pp. 10–14.

Siliconware Precision Industries Ltd., TSOP 1 (Thin Small Outline Package type 1), 2 pages, retrieved from the Internet on Jun. 26, 2003, <http://www.spil.com.tw/tsopi.html>.

Intersil, L56.8×8 56 Lead Quad Flat No–Lead Plastic Package, 1 page, Dec. 2002, <http://www.intersil.com/data/pk/L56.8×8.pdf>.

Carson, John C., "Advances in Chip Level Packaging," Irvine Sensors Corporation, Costa Mesa, California, unpublished work, 36 pages, retrieved from the Internet on Jul. 17, 2003, <http://www.ece.jhu.edu/faculty/andreou/495/2002/LectureNotes/PackagingAdvancedpdf.pdf>.

U.S. Appl. No. 09/606,428, Farnsworth, filed Jun. 28, 2000.

U.S. Appl. No. 10/323,150, Lim Thiam Chye et al., filed Dec. 18, 2002.

Amkor Technology: Products: Leadframe: *Micro*LeadFrame (MLF), Aug. 1, 2001 (5 pages). <http://www.amkor.com/Products/all_products/MLF.cfm>.

Application Notes for Surface Mount Assembly of Amkor's *Micro*LeadFrame (MLF) Packages, Amkor Technology, Mar. 2001, (14 pages).

Automotive/Thermal Enhanced Power Products, Amkor Technology, Aug. 2000 (16 pages).

RF Wireless Fact Sheet, Amkor Technology, Feb. 2000.

* cited by examiner-

PACKAGED MICROELECTRONIC DEVICES AND METHODS OF FORMING SAME

CROSS-REFERENCE TO RELATED APPLICATION

This application claims foreign priority benefits of Singapore Application No. 200105297-6 filed on Aug. 29, 2001.

TECHNICAL FIELD

The present invention generally relates to microelectronic devices. The invention has particular utility in connection with forming packaged microelectronic assemblies.

BACKGROUND

Microelectronic devices such as semiconductor dies or chips are typically contained in packages, sometimes referred to as first level packaging. The package helps support and protect the microelectronic device and can provide a lead system for distributing power and electronic signals to the microelectronic device. Increasing emphasis is being placed on minimizing the size of packaged microelectronic assemblies for use in smaller devices, such as handheld computers and cellular phones. Minimizing the footprint of these assemblies saves valuable real estate on the circuit board or other substrate carrying the devices. Reducing the thickness also enables the microelectronic device to be used in smaller spaces.

One type of packaged microelectronic assembly which has gained acceptance in the field is a so-called "quad flat leaded" (QFN) package. Older-style packaged semiconductor dies are formed with leads extending laterally outwardly beyond the die and the encapsulant within which the die is packaged. These leads are bent down and passed through or attached to a printed circuit board or other substrate. In a QFN package, the leads do not extend outwardly beyond the encapsulant. Instead, a series of electrical leads are positioned around a periphery of the lower surface of the packaged device. The downwardly-facing leads of QFN packages may be electrically coupled to a substrate using solder ball connections to bond pads on the substrate.

In manufacturing a conventional QFN package, the die is supported on a paddle above the inner ends of a plurality of electrical leads. The die is typically attached to an upper surface of the paddle using an adhesive. Bond wires are then used to electrically couple the die to the electrical leads. The terminals carried by the die for connection to the bond wires are spaced well above the electrical leads due to the thickness of the paddle, the thickness of the die, and the thickness of the adhesive used to bond the die to the paddle. The bond wires define loops extending upwardly from the upper surface of the die, further increasing the height of the structure. While the bottom surfaces of the electrical leads and the paddle tend to remain exposed, the rest of the QFN package is enclosed within an encapsulant, typically a moldable resin material. This resin extends upwardly above the tops of the bond wire loops. As a consequence, QFN packages tend to be appreciably thicker than the height of the die.

One increasingly popular technique for maximizing device density on a substrate is to stack microelectronic devices one on top of another. Stacking just one device on top of a lower device can effectively double the circuitry carried within a given footprint. In forming a stacked microelectronic device assembly, it is necessary to provide electrical connections between the substrate and the upper component(s). Unfortunately, QFN packages only provide electrical connections around the periphery of the bottom surface of the package. This effectively prevents an upper QFN package from being electrically coupled to the lower QFN package or the substrate.

U.S. Pat. No. 6,020,629 (Farnworth et al., the entirety of which is incorporated herein by reference) suggests an alternative to a QFN package which permits microelectronic devices to be electrically coupled to one another in a stacked arrangement. This package employs a relatively thick, multi-layer substrate. The die is bonded to the lower surface of a middle layer of the substrate. Electrical leads are carried along the upper surface of the middle layer and the die is wire bonded to these leads. Vias can be laser-machined through the entire thickness of the multi-layer substrate and filled with a conductive material. These vias are electrically connected to the electrical leads, defining an electrical pathway from the electrical leads to a contact pad carried on the lower surface of the substrate. Farnworth's multi-layer substrate adds to the overall thickness of the device, however. In addition, the use of filled vias to provided an electrical connection from the upper surface to the lower surface of this substrate limits the ability to use conventional QFN packaging techniques, which have been developed for high throughput applications.

SUMMARY

Embodiments of the present invention provide microelectronic device assemblies and methods of assembling such assemblies. In accordance with one such embodiment providing a method of assembling a microelectronic device assembly, a support is releasably attached to a lead frame. The lead frame has a thickness and an opening passing through the thickness. An exposed surface of the support spans the opening. A back surface of a microelectronic device, e.g., a semiconductor die, is releasably attached to the exposed surface of the support. The microelectronic device may be electrically coupled to the lead frame. An encapsulant may then be delivered to a cavity defined by the support, the microelectronic device, and a peripheral dam carried by the lead frame. The encapsulant bonds the microelectronic device to the lead frame. The support may then be removed, leaving the back surface of the microelectronic device exposed. In a further adaptation of this embodiment, the lead frame is cut within a periphery defined by the peripheral dam to separate a plurality of electrically isolated lead fingers from the lead frame.

An alternative embodiment of the invention provides a method of assembling the microelectronic device assembly which includes a microelectronic die and plurality of electrically independent lead fingers. In accordance with this method, a first support is releasably attached to a back surface of a first lead frame and to a back surface of a first microelectronic die. The first lead frame includes a front surface spaced from the back surface and an opening extending from the front surface to the back surface. The opening has an inner periphery defined by a first outer member and a plurality of first lead fingers extending inwardly from the first outer member. The first die is positioned in the opening with a periphery of the first die spaced inwardly of at least part of the inner periphery of the opening to define a first peripheral gap. The first die is electrically coupled to the first lead fingers with a plurality of first bonding wires. The opening may be filled above the first support with a first encapsulant. The first encapsulant may enter the first peripheral gap and attach the first lead frame to the first die. The first support may be removed, leaving the back surface of the first die exposed and leaving the back surface of the first lead frame exposed. If so desired, the first lead fingers may then be separated from the first outer member, yielding a plurality of independent first lead fingers connected to one another only by the first encapsulant and the first bonding wires via the first die.

An alternative embodiment of the invention provides a stacked microelectronic device assembly which includes a first subassembly, a second subassembly, and a plurality of electrical connections. The first and second subassemblies may have much the same structure. The first subassembly, for example, may have a first thickness and include a plurality of electrically independent first lead fingers, a first die, and a first encapsulant bonding the first die to the first lead fingers. Each of the first lead fingers may have a thickness equal to the first thickness and define an exposed front finger surface and an exposed back finger surface. The first die includes an exposed back surface and a front surface. The front surface of the die may be electrically coupled to a plurality of first lead fingers by a plurality of first bonding wires. Each of the electrical connections may electrically couple the exposed front finger surface of one of the first lead fingers to the exposed back finger surface of one of the second lead fingers.

A microelectronic device assembly in accordance with an alternative embodiment of the invention includes a die having a front die surface, an exposed back die surface, and a die periphery extending between the front die surface and the back die surface. The microelectronic device assembly also includes a plurality of electrical leads, with each of the electrical leads having a body extending between a front electrical contact and a back electrical contact. Each of a plurality of bonding wires may electrically couple the die to one of the electrical leads. An encapsulant may have a front encapsulant surface and a back encapsulant surface. The encapsulant may enclose the bonding wires, the front die surface, the peripheral die surface and at least a portion of the body of each of the electrical leads. The front electrical contacts of the electrical leads are exposed adjacent the front surface of the encapsulant and the back electrical contacts of the electrical leads are exposed adjacent the back surface of the encapsulant in a staggered array. This staggered array may comprise a first set of the back electrical contacts exposed adjacent the periphery of the back encapsulant surface and a second set of the back electrical contacts exposed at locations spaced inwardly from the periphery of the back encapsulant surface.

DETAILED DESCRIPTION

Figure 1A:
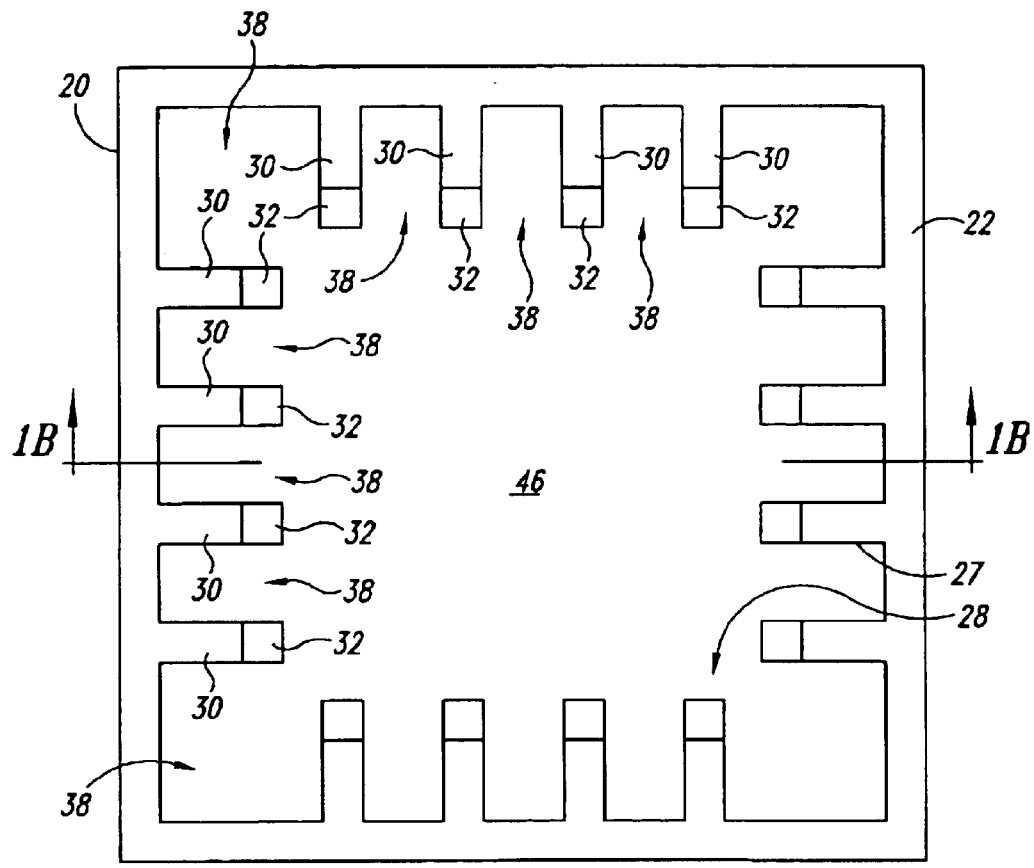
FIG. 1A is a front elevational view of a subassembly in accordance with one embodiment of the invention including a lead frame and a support.

Various embodiments of the present invention provide microelectronic devices and methods for forming such devices. The following description provides specific details of certain embodiments of the invention illustrated in the drawings to provide a thorough understanding of those embodiments. It should be recognized, however, that the present invention can be reflected in additional embodiments and the invention may be practiced without some of the details in the following description.

Figure 1B:
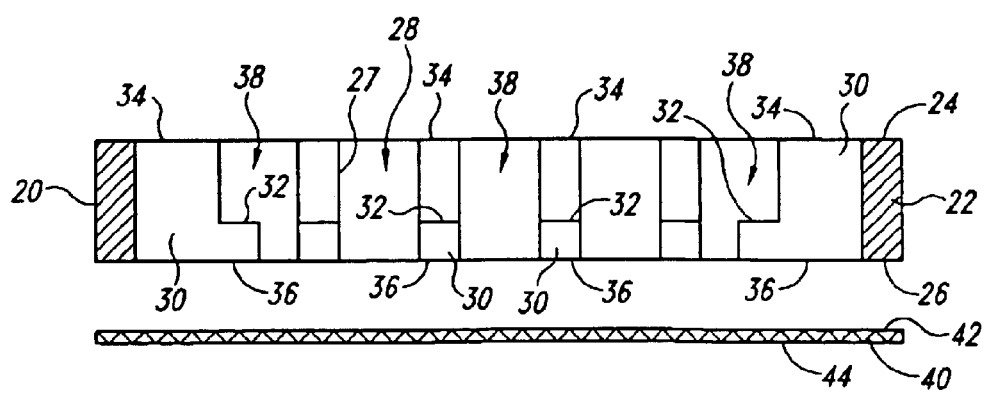
FIG. 1B is a schematic cross-sectional view taken along line 1B—1B in FIG. 1A.

As noted above, FIGS. 1–7 schematically illustrate successive stages in manufacturing a microelectronic device assembly in accordance with one embodiment of the invention. FIGS. 1A–1B illustrate a first stage in assembling the microelectronic device assembly 10 of FIGS. 7A–C in accordance with one method of the invention. In FIGS. 1A–B, a lead frame 20 is juxtaposed with a support 40. The lead frame 20 generally includes a peripheral dam 22, a front surface 24 and a back surface 26. The peripheral dam 22 may extend generally vertically from the back surface 26 to the front surface 24.

A plurality of lead fingers 30 may extend inwardly of the peripheral dam 22. Each of the lead fingers 30 may have a height equal to the height of the lead frame 20. A front contact 34 of each lead finger 30 may be aligned with the front surface 24 of the rest of the lead frame 20 and a back contact 36 of each lead finger 30 may be aligned with the rest of the back surface 26 of the lead frame 20. Each of the lead fingers 30 should be adapted to be electrically coupled to a die 60. If the die 60 is to be electrically coupled to the lead fingers 30 by conventional wire bonding, each of the lead fingers 30 may include a bond pad 32 to provide a convenient area for connection to the bonding wire (75 in FIGS. 7A–C). The lead fingers 30 are spaced from one another to define a series of gaps 38 therebetween.

The inner surfaces of the peripheral dam 22 and each of the lead fingers 30 together define an inner periphery 27 of an opening 28 in the lead frame 20. The opening 28 extends through the entire thickness of the lead frame 20, i.e., from the front surface 24 to the back surface 26 of the lead frame 20.

The lead frame may be formed of any suitable conductive material. Typically, the lead frame will be formed of a metal, with at least a portion of the lead frame plated with a noble metal such as gold, silver, or palladium.

For reasons explained more fully below, the support 40 is adapted to sealingly yet releasably engage a surface of the lead frame 20. In particular, the support 40 includes a front surface 42 and a back surface 44. The front surface 42 is adapted to seal against the back surface 26 of the lead frame 20. In one embodiment, the support 40 comprises a flexible polymeric tape which may adhere to the back surface 26 of the lead frame 20. The support 40 may be formed of a flexible thermoplastic material and be releasably bonded directly to the lead frame 20 by heating. Alternatively, the support may include a contact adhesive on the front surface 42. The contact adhesive and the body of the support 40 should be formed of materials which are capable of withstanding high temperatures or other conditions which may be encountered in manufacturing the microelectronic device assembly 10. Nitto Denko Corporation sells a thermal resist masking tape under the product designation TRM-6250 which is expected to be suitable for use as a support 40 in connection with one embodiment of the invention.

When the support 40 is brought into contact with the back surface 26 of the lead frame 20, it seals against the back of the peripheral dam 22 and against the back contact 36 of each of the lead fingers 30. This will create a seal along the lower edge of the inner periphery 27 of the opening 28 in the lead frame 20 and leave an exposed surface 46 of the support 40 spanning the opening 28.

Figure 2A:
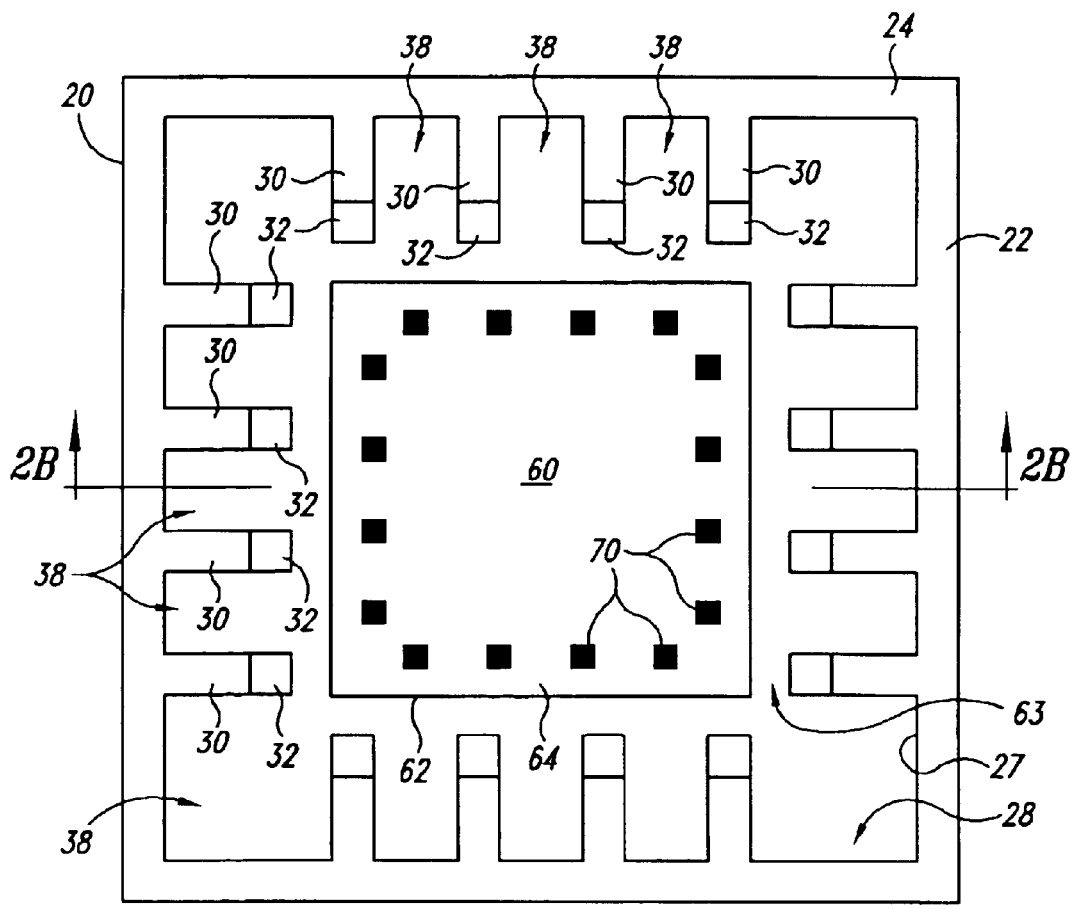
FIG. 2A is a front elevational view of a die received in the subassembly shown in FIG. 1A.
Figure 2B:
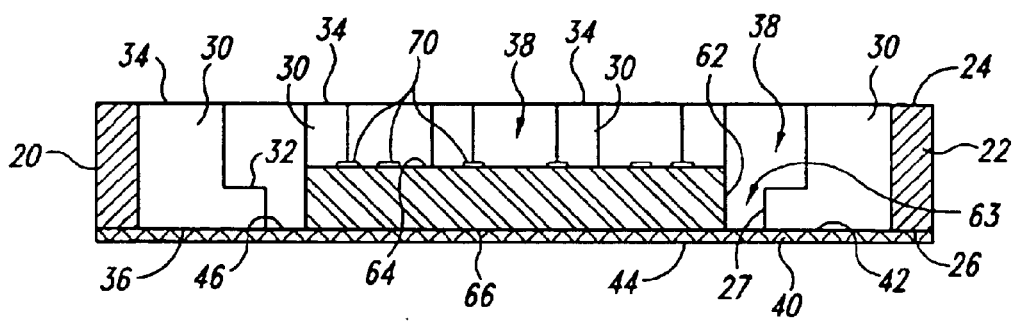
FIG. 2B is a cross-sectional view taken along line 2B—2B of FIG. 2A.

As shown in FIGS. 2A–2B, a die 60 may be positioned within the opening 28 in the lead frame 20. The die 60 may include a front surface 64, a back surface 66, and periphery 62 extending between the front surface 64 and the back surface 66. A plurality of terminals 70 may be arranged on the front surface 64 of the die in a terminal array. In the illustrated embodiment, these terminals 70 are arranged adjacent the periphery 62 of the die 60. It should be understood, though, that other arrangements could be employed, such as a conventional lead-on chip die having a series of terminals arranged along a center line of the die 60.

The back surface 66 of the die may be releasably attached to the exposed surface 46 of the support 40 within the opening 28 of the lead frame 20. The support 40 may temporarily hold the die 60 in a predetermined relationship with respect to the lead frame 20 to facilitate electrical coupling of the die 60 to the lead frame 20. In FIGS. 2A–B, the die 60 is positioned with its periphery 62 spaced inwardly of the inner periphery 27 of the opening 28. This will define a peripheral gap 63 between the periphery 62 of the die 60 and the inner periphery 27 of the lead frame 20.

The order in which the lead frame 20 and die 60 are attached to the support 40 can be varied. In one embodiment of the invention, the lead frame 20 is attached to the support 40 and the die 60 is then attached to the exposed surface 46 of the support 40 within the opening 28 of the lead frame 20. In an alternative embodiment, the die 60 is first attached to the support 40 and the lead frame 20 is then attached to the support 40. In another embodiment, the lead frame 20 and the die 60 may be simultaneously attached to the support 40.

Figure 3A:
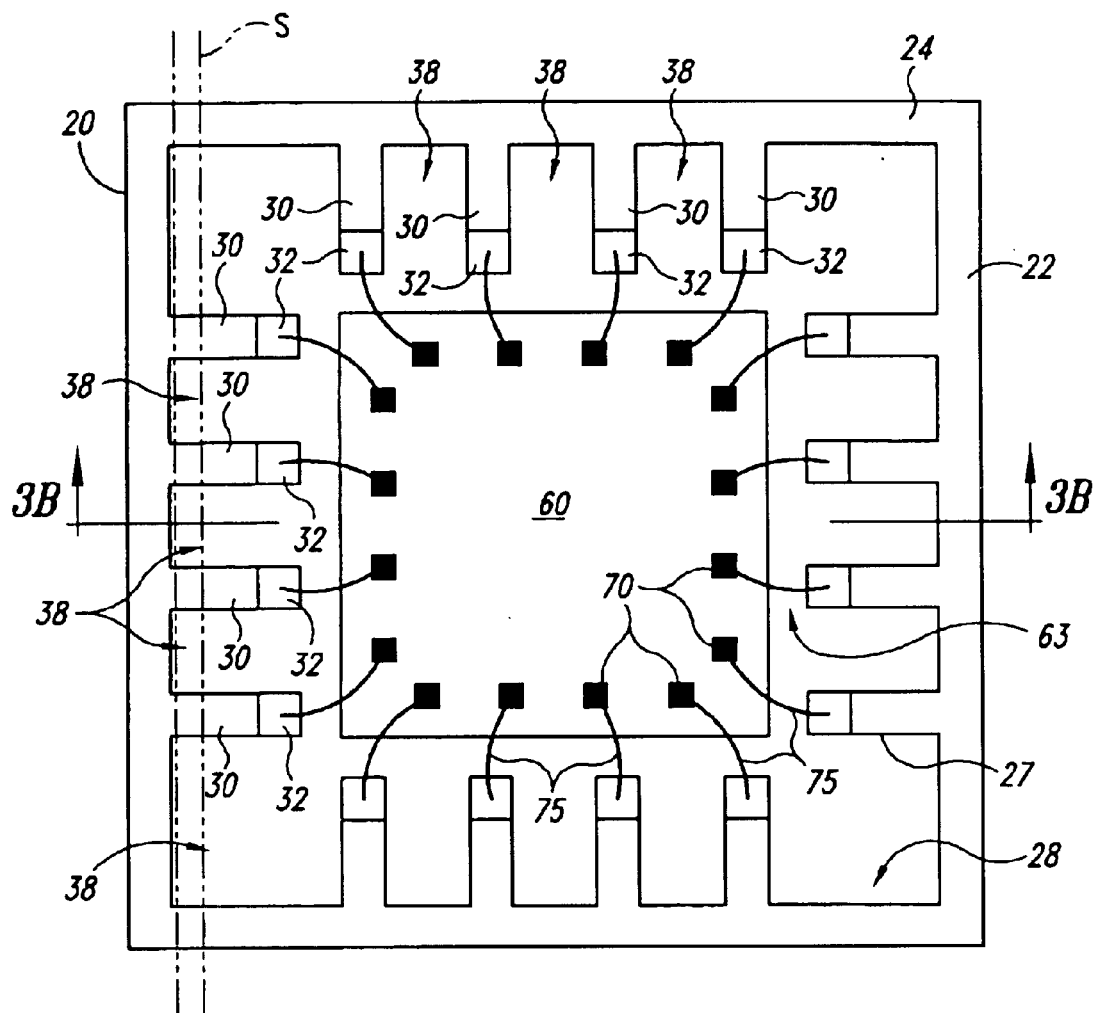
FIG. 3A is a front elevational view of the subassembly of FIG. 2A wherein the die is wire bonded to the lead frame.
Figure 3B:
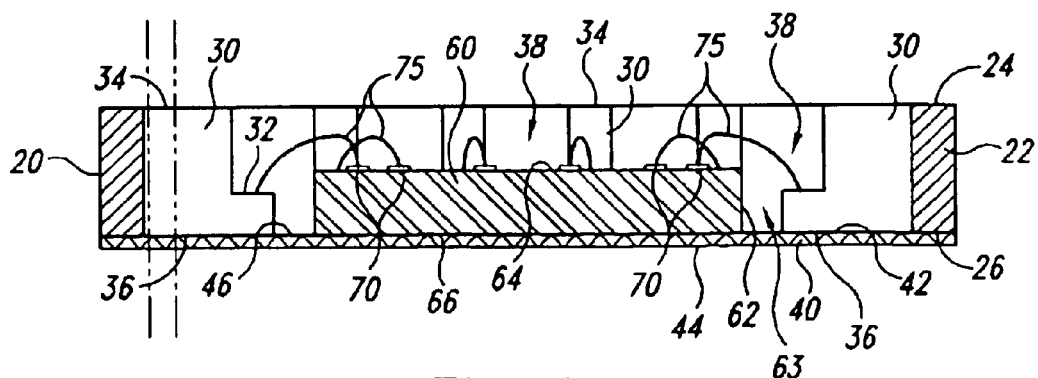
FIG. 3B is a cross-sectional view taken along line 3B—3B of FIG. 3A.

With the die 60 and the lead frame 20 attached to the support 40, the die 60 may be electrically coupled to the lead fingers 30 of the lead frame 20. This electrical coupling can be accomplished in any suitable fashion. As shown in FIGS. 3A–B, each of a plurality of bonding wires 75 may be coupled at one end to a terminal 70 of the die 60 and at the other end to a bond pad 32 of one of the lead fingers 30. The bonding wires 75 desirably have a loop height which extends no farther outwardly from the front face 64 of the die 60 than the front face 24 of the lead frame 20. As shown in FIG. 3B, the bonding wires 75 may be spaced behind the upper surface 24 of the lead frame 20 to facilitate complete encapsulation of the bonding wires 75 by the encapsulant 80.

Figure 4:
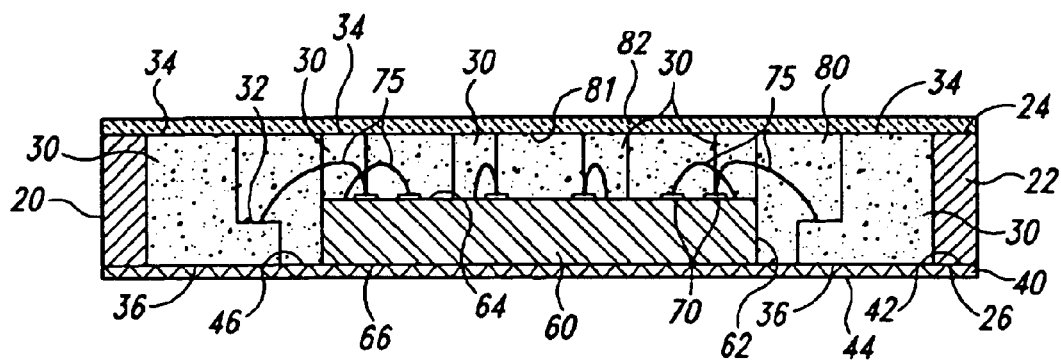
FIGS. 4–6 are successive cross-sectional views illustrating the addition of an encapsulant to the structure of FIG. 3.

Once the die 60 is suitably electrically coupled to the lead fingers 30, an encapsulant 80 may be delivered to the opening 28 in the lead frame 20, as shown in FIG. 4. The exposed surface 46 of the support, the inner periphery 27 of the lead frame 20, and the die 60 define a cavity which may be partially or completely filled with the encapsulant 80. In one embodiment, the peripheral gap 63 between the die 60 and the lead frame 20 is completely filled. The sealing attachment of the support 40 to the lead frame 20 and the die 60 helps prevent the encapsulant 80 from flowing over the back contacts 36 of the lead fingers 30 or the back surface 66 of the die 60.

Any suitable encapsulant 80 may be used. In one embodiment, the encapsulant 80 can be delivered as a flowable material and subsequently cured, such as by heat treatment, UV exposure, or any combination of heating and UV exposure. A wide variety of suitable epoxy resins and other non-conductive flowable materials are widely commercial available.

In one embodiment, the encapsulant 80 is delivered to the opening 28 in the lead frame 20 and is allowed to simply fill the cavity noted above, covering the bonding wires 75. If any encapsulant 80 flows outwardly over the front surface 24 of the lead frame 20, the excess encapsulant may be removed, such as by grinding or polishing or with a solvent. In an alternative embodiment of the invention, however, flow of the encapsulant material 80 is limited by use of a front molding element 82. This front molding element may have a substantially flat molding face 81 which may lie substantially flush against the front surface 24 of the lead frame 20. This keeps the upper surface 84 of the encapsulant 80 at the same height as the upper surface 24 of the lead frame so the front contacts 34 of the lead fingers 30 remain exposed after the encapsulation process is complete. If any encapsulant 80 does flow onto the front contacts 34 even with the use of the molding element 82, any excess encapsulant 80 on the front contacts 34 can be removed with solvents, by grinding or polishing, or other suitable techniques.

Figure 5:
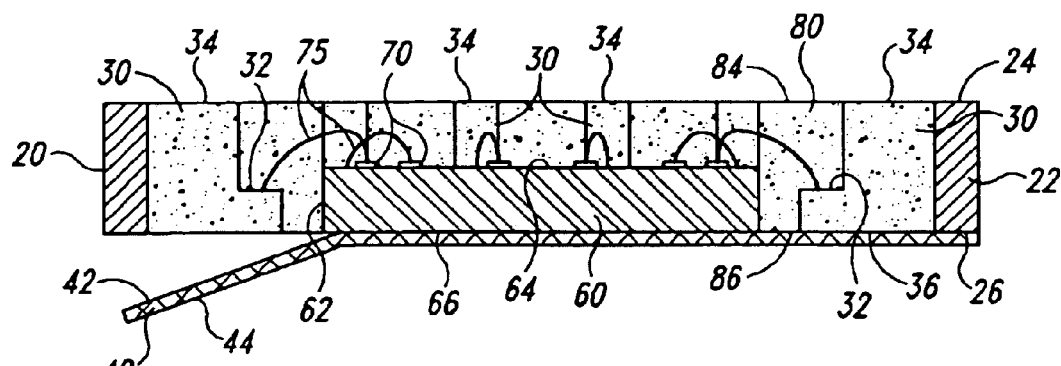

Once the encapsulant 80 is in place, any front molding element 82 which is used can be removed. The support 40 can also be removed from the back surface 26 of the lead frame 20 and the back surface 66 of the die 60. As schematically shown in FIG. 5, this may be accomplished simply by peeling the support 40 away from the rest of the structure. If any adhesive material from the support 40 remains when the support 40 is peeled away, such excess adhesive may be cleaned away using an appropriate solvent which is compatible with the lead frame 20, the die 60 and the encapsulant 80.

Figure 6:
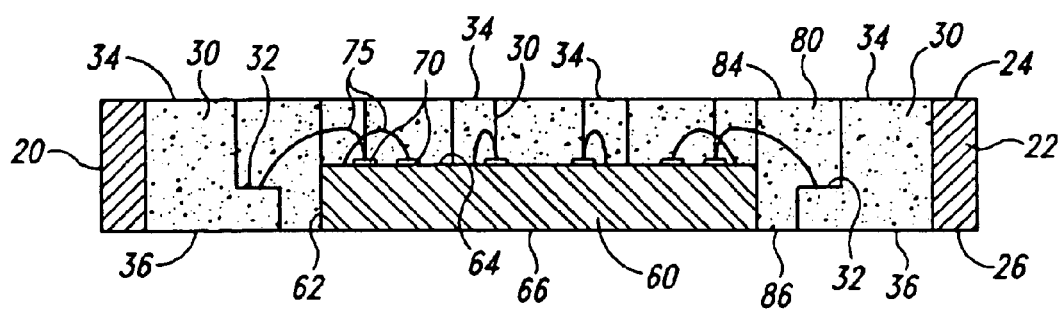

As shown in FIG. 6, the encapsulant 80 which is produced in this process may have a front surface 84 which is substantially co-planar with the front surface 24 of the lead frame 20 and the front contacts 34 of each of the lead fingers 30. A back surface 86 of the encapsulant 80 may be substantially co-planar with the back surface 66 of the die 60, the back contacts 36 of the lead fingers 30 and the back surface 26 of the lead frame 20. This yields a mechanically stable structure wherein each of the lead fingers 30 defines an electrical pathway between an exposed back contact 36 and an exposed front contact 34. As explained below, this can facilitate stacking of the microelectronic device assemblies 10.

The exposed back surface 66 of the die 60 also helps facilitate cooling of the die 60. In conventional QFN packages, the back surface of the die rests on a paddle and any heat generated in the die must be transferred through an adhesive to the paddle and then to the ambient environment or any attached heat sink. By leaving the back surface 66 of the die 60 exposed, the die 60 has a direct communication with a cooling medium, such as an ambient environment. If so desired, one can also attach a suitable heat sink (not shown) directly to the back surface of the die, minimizing the unnecessary thermal mass between the die 60 and the heat sink found in QFN packages.

In the structure shown in FIG. 6, the peripheral dam 22 physically connects each of the lead fingers 30 to one another. While the peripheral dam 22 helps define the cavity for receiving the encapsulant 80, once the encapsulant 80 is in place, this peripheral dam can be detached from the lead fingers 30. The peripheral dam 22 may be separated from the lead fingers 30 in any suitable fashion, such as by cutting the peripheral dam 22, an outer length of the lead fingers 30, or both the peripheral dam 22 and a portion of the lead fingers 30. In one embodiment of the invention, the lead frame 20 is cut within the periphery of the peripheral dam 22 using a conventional wafer saw, high-pressure water jets, lasers, or the like. FIGS. 3A–B schematically illustrate a saw path S which a saw blade other cutting implement may follow in cutting one side of the lead frame 20.

Figure 7A:
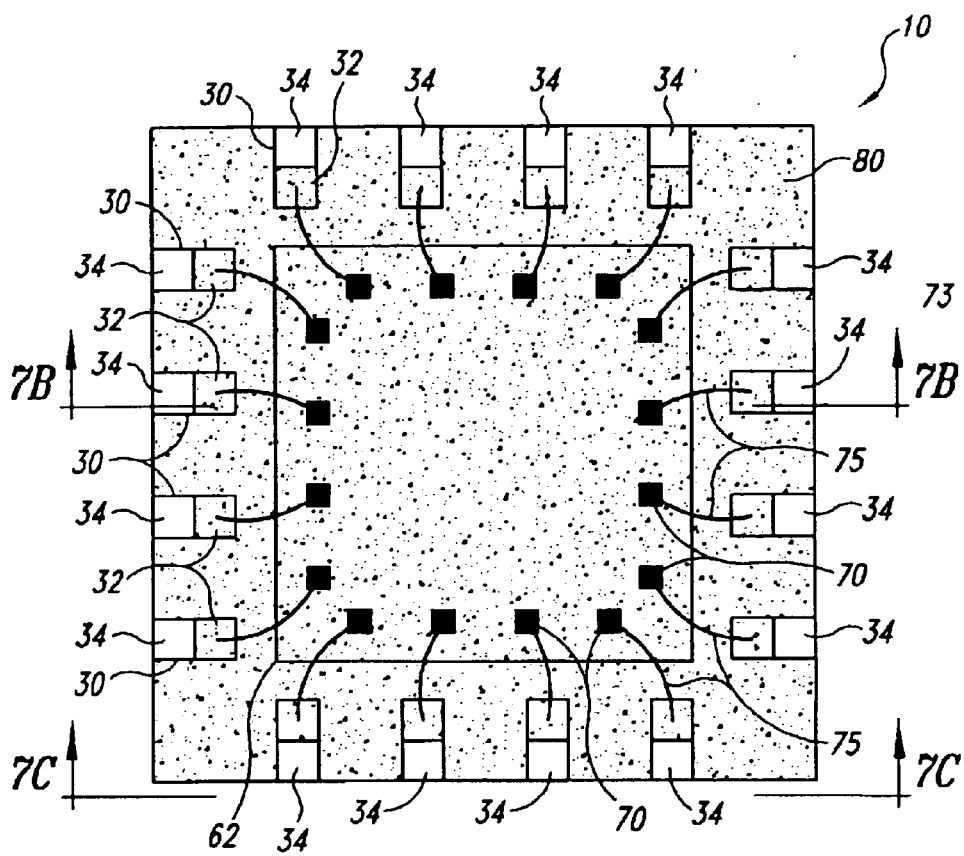
FIG. 7A is a front elevational view of an assembled microelectronic device assembly in accordance with an embodiment of the invention.
Figure 7B:
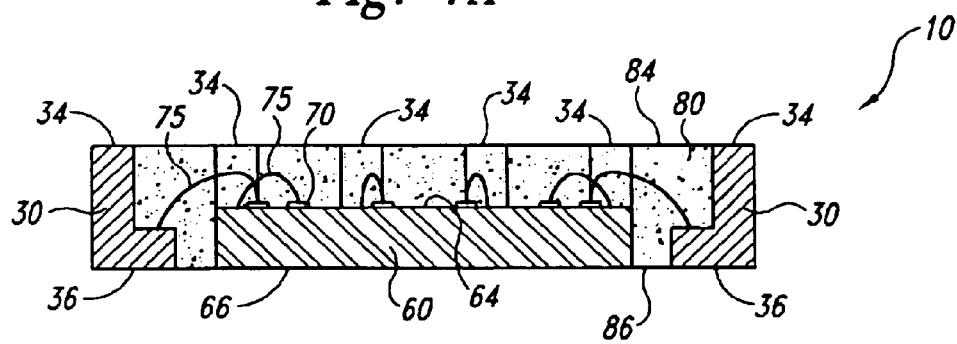
FIG. 7B is a cross-sectional view taken along line 7B—7B of FIG. 7A.
Figure 7C:
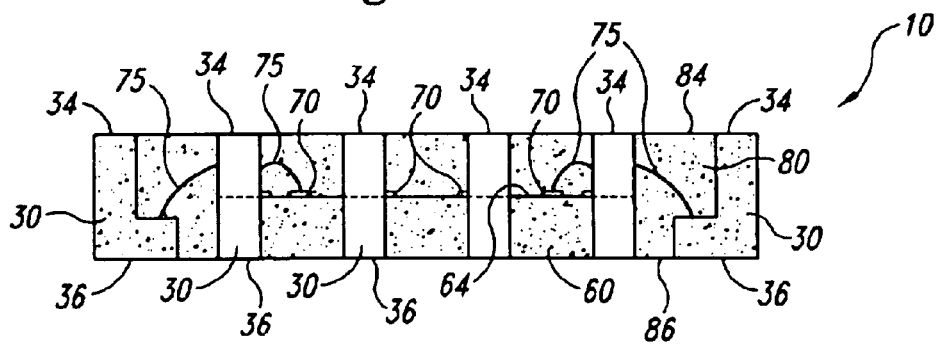
FIG. 7C is an edge elevational view taken along line 7C—7C of FIG. 7A.

As shown in FIGS. 7A–C, separating the peripheral dam 22 will yield a series of electrically isolated lead fingers 30 which are spaced about a periphery of the microelectronic device assembly 10. In particular, the front contacts 34 are peripherally aligned around the periphery of the front surface 84 of the encapsulant 80 and the back contacts 36 of the lead fingers 30 are peripherally aligned about the back surface 86 of the encapsulant 80.

After separation of the lead fingers 30 from the peripheral dam 22, the lead fingers 30 are connected to one another only by the encapsulant 80 and the bonding wires 75 via the die 60. The bonding wires 75 are thin and relatively fragile and provide little structural support. As a consequence, the encapsulant 80 is the primary structural element supporting the lead fingers 30 with respect to one another and with respect to the die 60. By permitting the encapsulant 80 to flow into the gaps 38 (FIGS. 1–3) between the lead fingers 30, the encapsulant can surround at least three surfaces of the body of each lead finger 30. This helps promote a strong structural bond between the encapsulant 80 and the lead fingers 30. The presence of the encapsulant 80 in the gaps 38 also helps support the lead fingers 30 as the lead fingers 30 are cut from the peripheral dam 22 with a saw.

If so desired, more complex lead finger shapes may be used instead of the fairly simple, L-shaped lead fingers 30 in the illustrated drawings. For example, the lead fingers 30 may have tapered or chamfered profiles, with each lead finger 30 tapering outwardly to a larger dimension in a direction away from the periphery of the microelectronic device assembly 10 or away from the back face 86 of the encapsulant. Such shapes can lead to a dovetail-like fit between the lead fingers 30 and the encapsulant 80, further enhancing the mechanical link between the lead frames 30 and the encapsulant.

Employing the encapsulant 80 as the primary structural support for both the die 60 and the lead fingers 30 reduces the thickness of the microelectronic device assembly 10. As noted above, U.S. Pat. No. 6,020,629 (Farnworth et al.) proposes a structure wherein a die is bonded to a middle layer of a multiple-layer substrate. The bonding wires must then pass through the middle layer to be attached to the leads. The leads have a thickness which extends above the top of the substrate and the lower contact pad extends below the bottom of the substrate. In comparison, the microelectronic device assembly 10 of FIGS. 7A–C need only be thick enough to readily accommodate the thickness of the die 60 and the loop height of the bonding wires 75; there is no need for any intermediate substrate. The lead fingers 30 extend the full height of the microelectronic device assembly 10, with their front surfaces defining front contacts 34 and their back surfaces defining back contacts 36. This simple design permits the total height to reduced because there is no need to form separate vias and contact pads.

Figure 8:
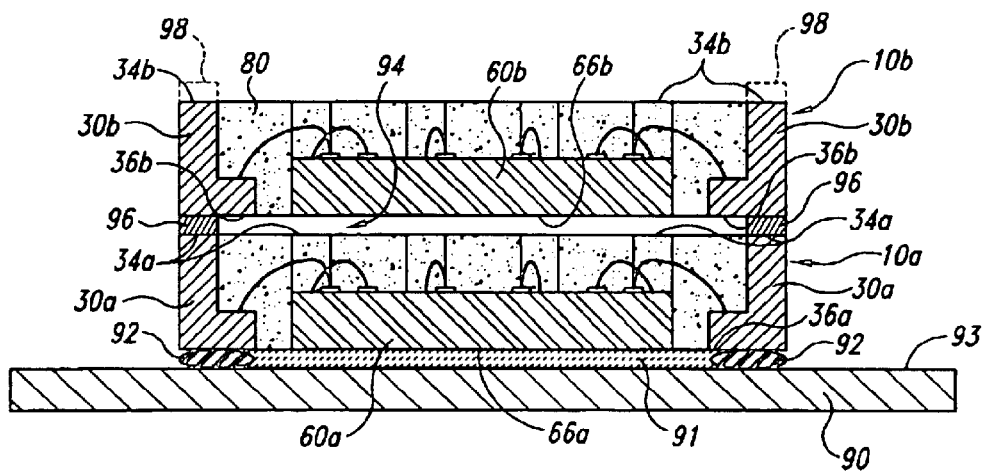
FIG. 8 is a schematic cross-sectional view illustrating a stacked microelectronic device assembly in accordance with a further embodiment of the invention.

FIG. 8 illustrates one possible application of a microelectronic device assembly 10 of FIGS. 7A–C. In particular, FIG. 8 illustrates a stacked microelectronic device assembly wherein a pair of microelectronic device assemblies 10 such as the one shown in FIGS. 7A–C may serve as microelectronic subassemblies. Hence, a first subassembly 10a includes a die 60a and a plurality of lead fingers 30a, each of which has a back contact 36a and a front contact 34a. The back contact 36a of some or all of the lead fingers 30a may be electrically coupled to the substrate 90 in any conventional fashion. For example, the lead fingers 30a can be coupled to the substrate 90 using solder balls, reflowed connections, or other connections employed in flip chip technologies or in attaching QFN packages to substrates. To enhance the mechanical bond between the stacked device assembly 12 and the substrate 90, an underfill material 91 may fill the standoff gap between the lower microelectronic subassembly 10a and the mounting surface 93 of the substrate 90.

The outer microelectronic device subassembly 10b also includes a plurality of lead fingers 30b disposed about a die 60b. Each of the lead fingers 30b includes a front contact 34b and a back contact 36b. One or more of the lead fingers 30b of the upper subassembly 10b may be electrically coupled to one or more lead fingers 30a of the lower subassembly 10a. In one embodiment, each of the upper lead fingers 30b is electrically coupled to one of the lower lead fingers 30a by an electrical connector 96. The electrical connectors 96 may also physically bond the upper subassembly 10b to the lower subassembly 10a. These electrical connectors 96 may, for example, comprise solder connections which are reflowed as is known in the art.

The electrical connector 96 has a thickness which spaces the first and second subassemblies 10a–b from one another, defining an intercomponent gap 94 therebetween. If so desired, this intercomponent gap 94 can be filled with an underfill material or the like. This is not believed to be necessary, though, and leaving the intercomponent gap 94 exposed to the ambient environment may further facilitate cooling of the die 60b via its exposed back surface 66. An outer covering 98 of an electrically insulative material may be applied over the front contacts 36b of the upper subassembly 10b to avoid any inadvertent electrical short circuits. Alternatively, a third microelectronic device (which may be another microelectronic device assembly 10 such as that shown in FIGS. 7A–C) may be stacked on top of the second subassembly 10b and electrically connected thereto via the front contacts 34b.

Figure 9:
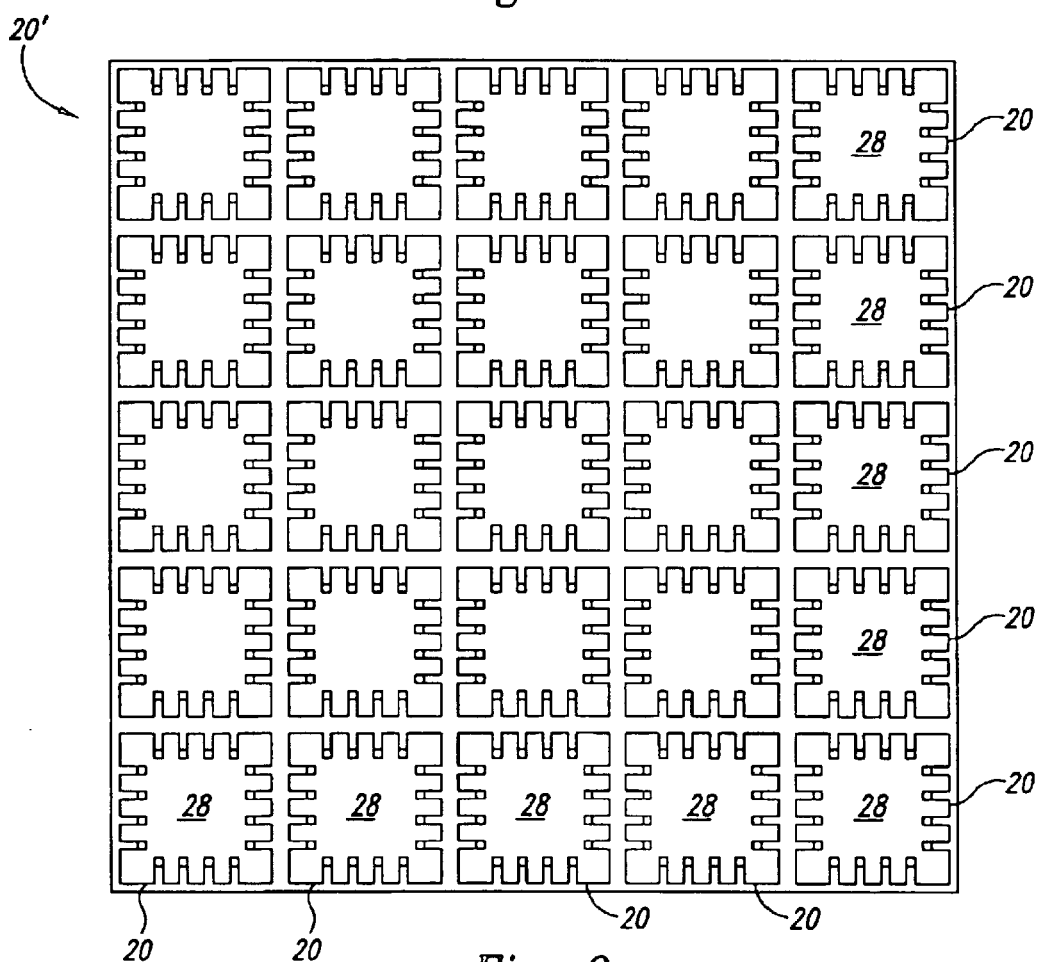
FIG. 9 is a front elevational view of a lead frame array in accordance with another embodiment of the invention.

FIGS. 1–8 illustrate a lead frame 20 having a single opening 28 for receiving a single die 60 therein. The microelectronic device assemblies 10 need not be assembled individually, though. As shown in FIG. 9, a lead frame array 20' may include a plurality of individual lead frames 20, each of which has a separate opening 28 for receiving a die (not shown). While the array 20' of FIG. 9 shows twenty-five lead frames 20 arranged in a regular array, any suitable number of lead frames 20 can be formed in a single array 20'. If so desired, all of the lead frames 20 may be arranged in a single elongated strip rather than arranged in a grid as shown in FIG. 9.

Figure 10A:
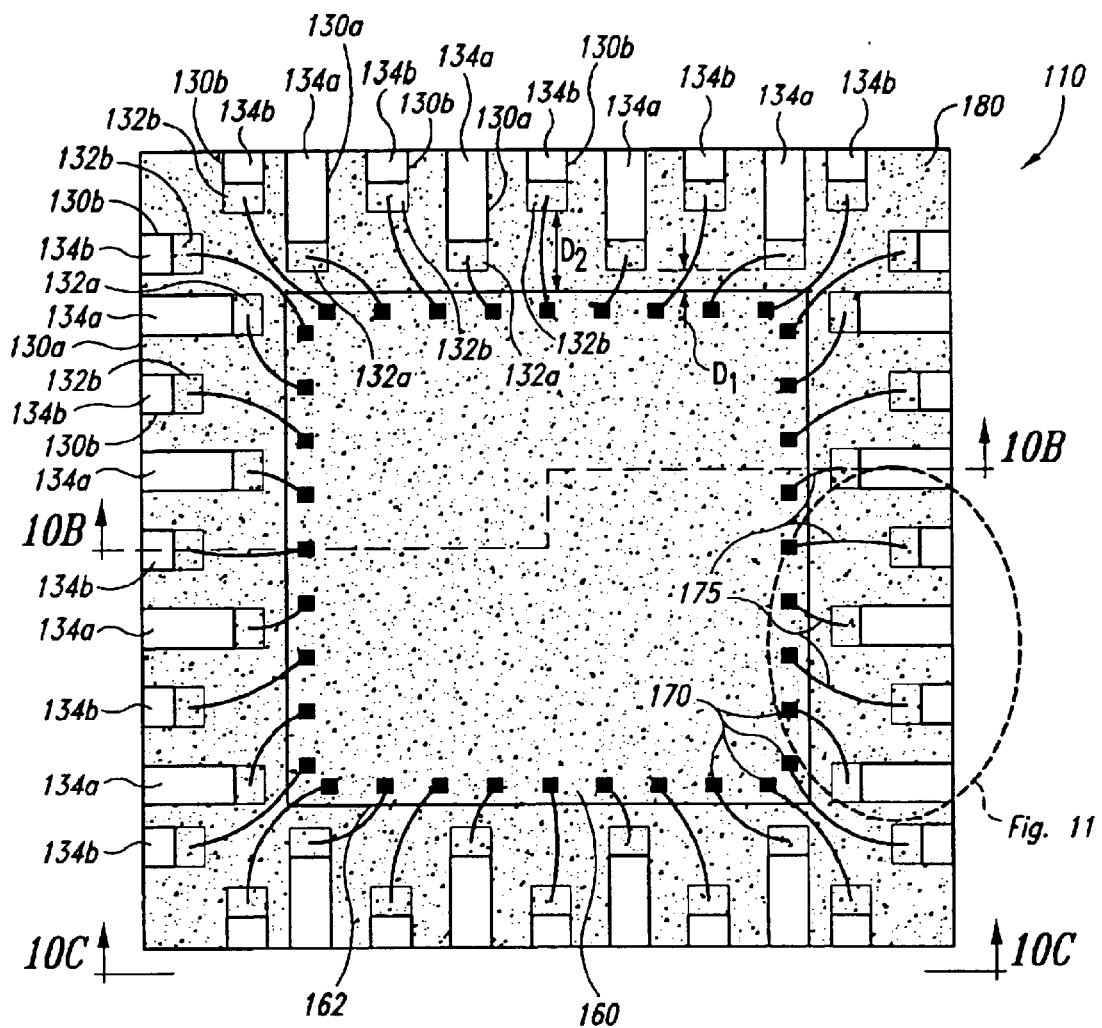
FIG. 10A is a front elevational view of a microelectronic device assembly in accordance with an alternative embodiment of the invention.
Figure 10B:
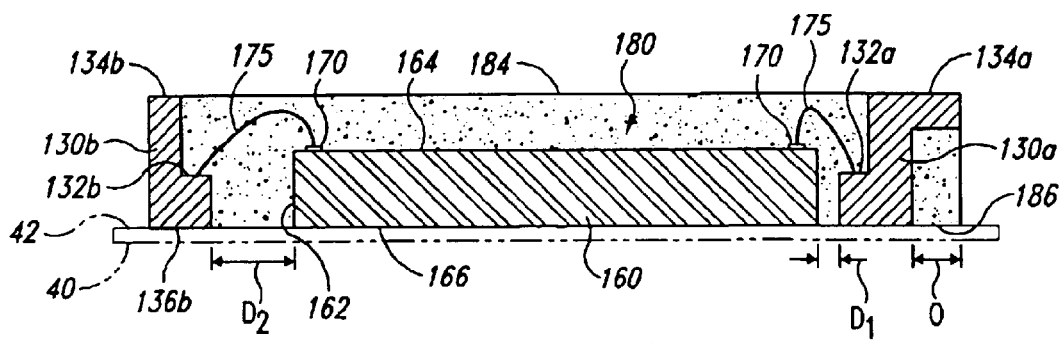
FIG. 10B is a cross-sectional view taken along line 10B—10B of FIG. 10A.
Figure 10C:
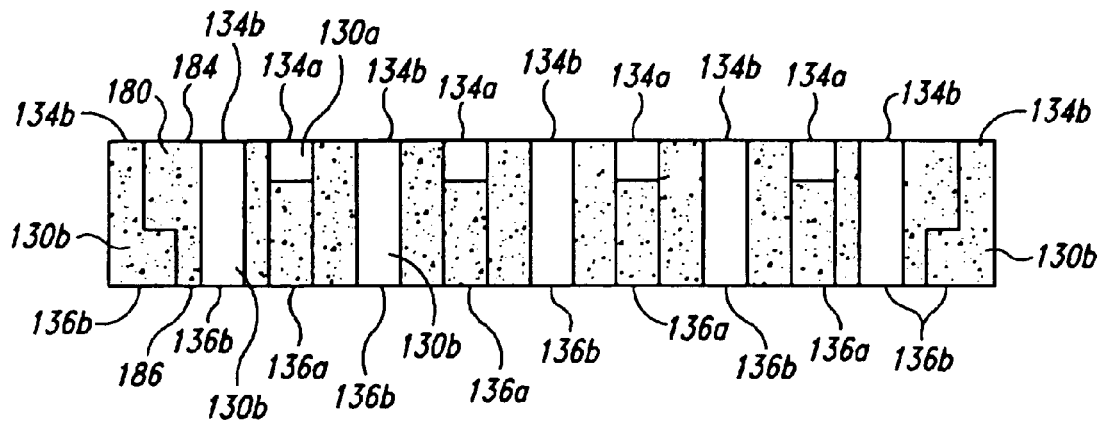
FIG. 10C is an edge elevational view taken alone line 10C—10C of FIG. 10A.
Figure 10D:
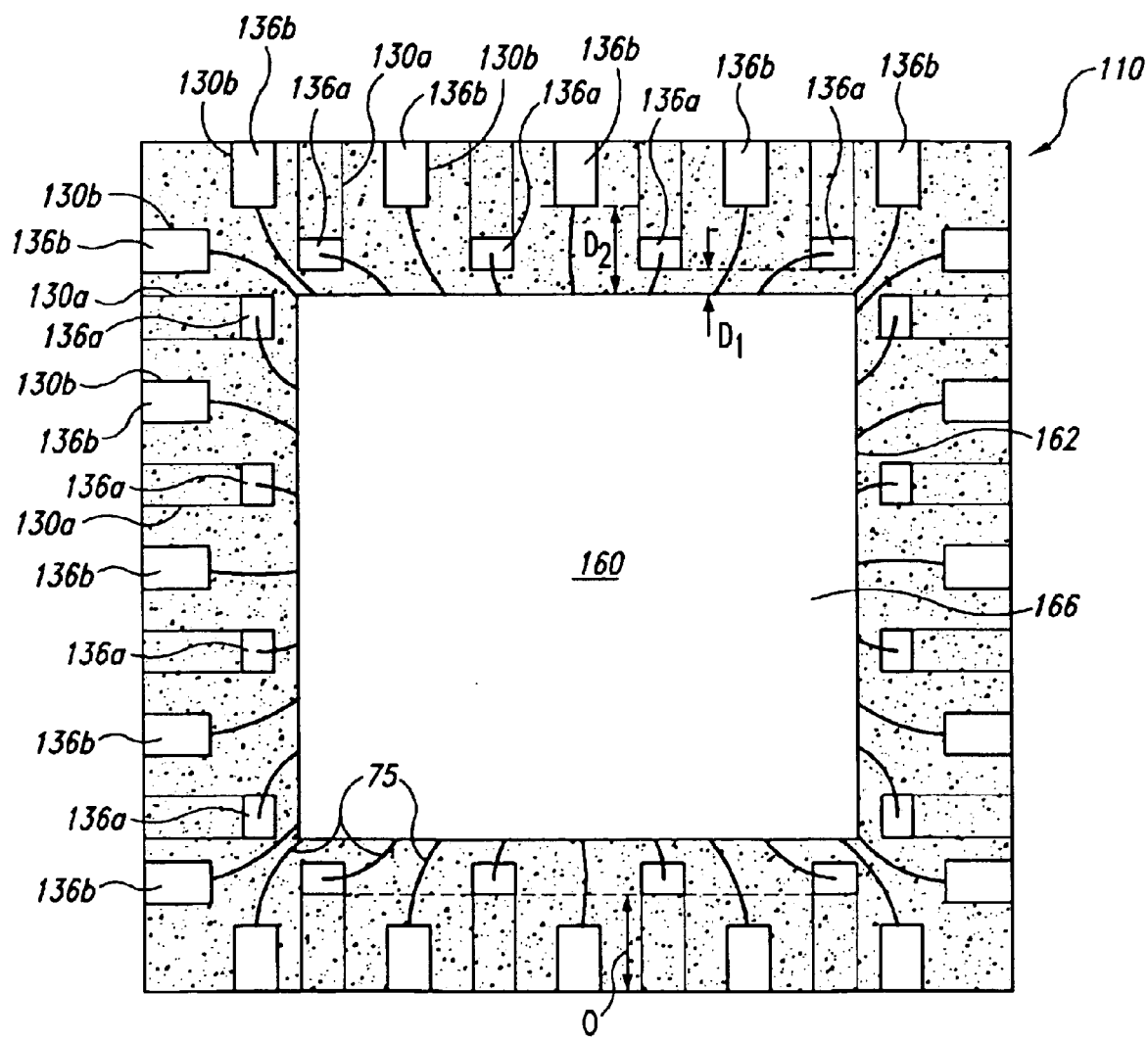
FIG. 10D is a back elevational view of the microelectronic device assembly of FIG. 10A.
Figure 11:
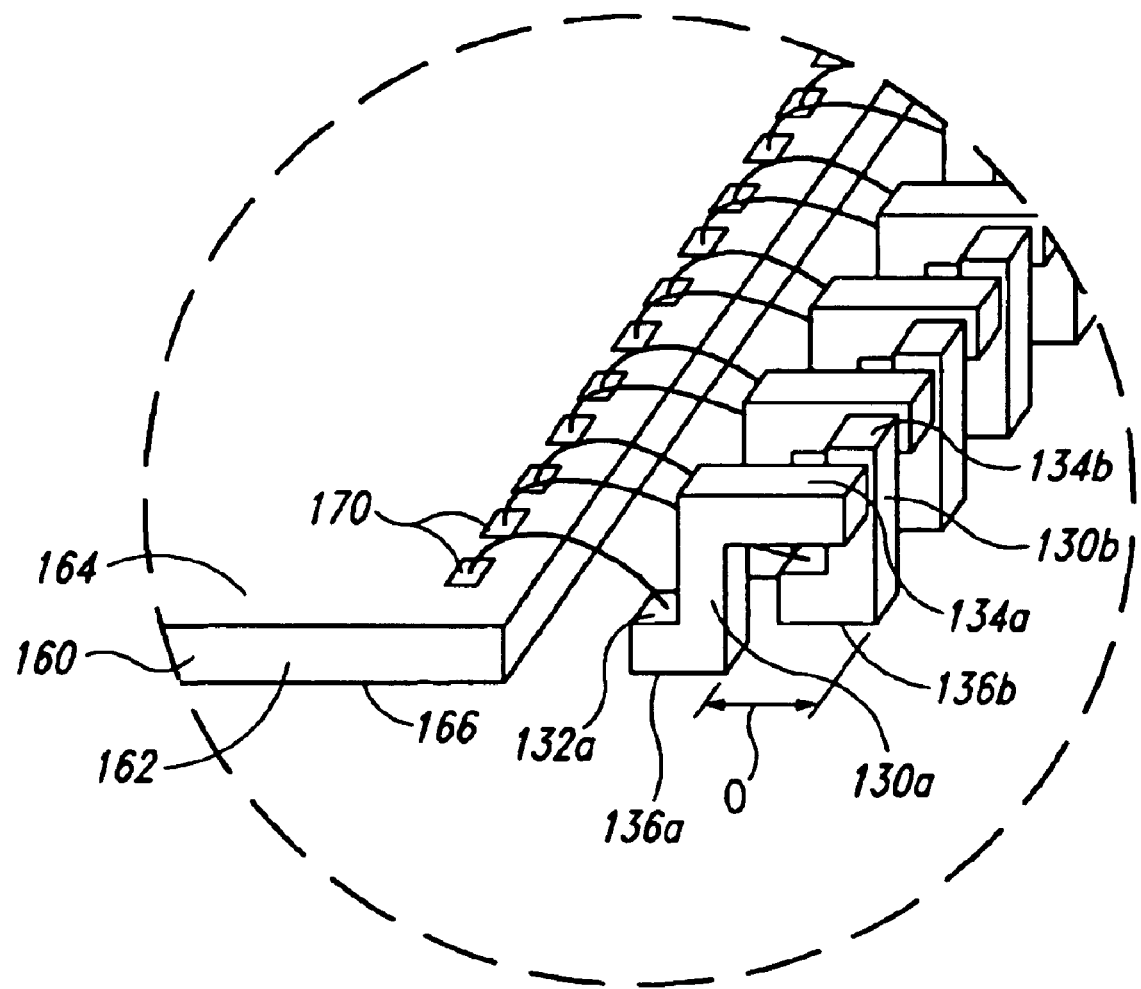
FIG. 11 is an isolation view schematically illustrating a portion of the microelectronic device assembly of FIG. 10A in greater detail.

FIGS. 10 and 11 schematically illustrate a microelectronic device assembly 110 in accordance with an alternative embodiment of the invention. (The encapsulant 80 has been omitted in the schematic view of FIG. 11 for purposes of clarity.) The structure of the microelectronic device assembly 110 of FIGS. 10A–D is analogous to the structure of the microelectronic device assembly 10 of FIGS. 7A–C. The microelectronic device assembly 110 includes a die 160 having a periphery 162 and a plurality of terminals 170 carried on a front surface 164 of the die 160. The die 160 may be electrically coupled to a plurality of lead fingers 130a–b by a plurality of bonding wires 175. The back surface 166 of the die 160 may remain exposed and be substantially coplanar with the back surface 186 of the encapsulant 180.

The microelectronic device assembly also includes a plurality of lead fingers 130 which are electrically coupled to the die 160 by a plurality of bonding wires 175. One of the distinctions between the microelectronic device assembly 110 of FIGS. 10 and 11 and the microelectronic device assembly 10 of FIGS. 7A–C relates to the shape and arrangement of the lead fingers 130. In FIGS. 7A–C, all of the lead fingers 30 were generally L-shaped and both the front contacts 34 and the back contacts 36 were peripherally aligned on the front surface 84 or the back surface 86, respectively, of the encapsulant 80. In the embodiment of FIGS. 10 and 11, though, the microelectronic device assembly 110 includes a plurality of first lead fingers 130a and a plurality of second lead fingers 130b. The first lead fingers 130a are spaced a first distance $D_1$ from the periphery 162 of the die 160 and the second lead fingers 130b are spaced a greater second distance $D_2$ from the periphery 162 of the die 160.

In the illustrated embodiment, the first lead fingers 130a all have the same first shape and the second lead fingers 130b all have the same second shape, but the first shape of the first lead fingers 130a is different from the second shape of the second lead fingers 130b. The second lead fingers 130b may be generally L-shaped having a bond pad 132b for connection to the bonding wires 175. This positions the front contact 134 and the back contact 136 adjacent the periphery of the microelectronic device assembly 110. In particular, the front contacts 134b of the second lead fingers 130b are aligned with the front encapsulant surface 184 and may be peripherally aligned on the front encapsulant surface 184. The back contacts 136b of the second lead fingers 130b may be exposed and peripherally aligned on the back encapsulant surface 186. The shape and orientation of the second lead fingers 130b is directly analogous to that of the lead fingers 30 in the microelectronic device assembly 10 of FIGS. 7A–C.

The first lead fingers 130a of FIGS. 10 and 11 may be generally Z-shaped. In particular, the front contact 134a may extend inwardly from the periphery of the microelectronic device assembly 110 a predetermined distance. This front contact 134a may be longer than the front contact 134b of the second lead fingers 130b. The back contact 136a of the lead fingers 130a is spaced inwardly from the periphery of the microelectronic device assembly 110 by a predetermined offset O. This back contact 136a may be positioned beneath the bond pad 132a of the lead finger 130a.

As shown in the front view of FIG. 10A, each of the front contacts 134a–b may be peripherally aligned and coplanar with the front surface 184 of the encapsulant 180. The first front contacts 134a may extend inwardly toward the die 160 farther than the second front contacts 134b. As shown in the back view of FIG. 10D, each of the second back contacts 136b are peripherally aligned and coplanar with the back surface 186 of the encapsulant 180. Each of the first back contacts 136a is spaced inwardly from the periphery of the microelectronic device assembly 110 by the predetermined offset O, though. This aligns the first back contacts 136a the first distance $D_1$ from the periphery 162 of the die 160 and aligns the second back contacts 136b the second distance $D_2$ from the die periphery 162. As a consequence, the first and second back contacts 136a–b define a staggered array of back contacts 136 which are exposed on the back surface 186 of the encapsulant 180.

This staggered array configuration provides a material improvement over the limited QFN package design. As noted above, QFN packages are conventionally limited to leads positioned at the periphery of the bottom surface of the package. By defining a staggered array of back contacts 136a–b, the microelectronic device assembly 110 of FIGS. 10 and 11 may be used in conventional ball-grid array or fine ball-grid array manufacturing processes, expanding their utility into other existing applications. The microelectronic device assembly 110 of FIGS. 10 and 11 may also be stacked one on top of the other in a manner directly analogous to the structure shown in FIG. 8. As noted above, the first front contacts 134a extend inwardly from the periphery of the device. This permits the first front contact 134a of a lower assembly 110 to be positioned beneath the inwardly offset first back contact 136a of an upper assembly 110. QFN packages cannot be stacked, as explained previously.

The microelectronic device assembly 110 of FIGS. 10 and 11 may be manufactured in a process directly analogous to that discussed above in connection with FIGS. 7A–C. In particular, each of the lead fingers 130a–b may be carried on a lead frame much like the lead frame 20 of FIGS. 1–6. A support (40 in FIG. 10B) may sealingly engage a lower surface of the lead frame, including the first and second back contacts 136a–b of the lead fingers 130a–b. The opening in the lead frame may then be filled with the encapsulant 180 and the peripheral dam of the lead frame may be cut away, leaving the structure shown in FIGS. 10A–B. FIG. 10B illustrates in dashed lines the position of the support 40 during manufacture to illustrate the relationship of the support 40 to the lead fingers 130a–b. The back contact 136b of the second lead fingers 130b extends inwardly from the periphery of the assembly 110. As a consequence, the support 40 may sealingly engage the second back contact 136 and preclude any encapsulant 180 from passing between the support 40 and the second lead finger 130b. The back contact 136a of the first lead finger 130a is offset from the periphery of the assembly 110. Over the length of this offset O, the first lead finger 130a is spaced above the front surface 42 of the support 40. As a consequence, the encapsulant 180 is permitted to flow between the support 40 and a length of each of the first lead fingers 130a beneath the first front contacts 134a. This both forms the staggered array of back contacts 136a–b and further encapsulates the first lead fingers 130a, enhancing the bond between the first lead fingers 130a and the encapsulant 180.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

What is claimed is:

1. A method of assembling a stacked microelectronic device assembly, comprising:

assembling a plurality of microelectronic device assemblies, each microelectronic device assembly being assembled by:

releasably attaching a support to a lead frame, the lead frame having a front surface, a back surface, a thickness, an opening passing through the thickness, and a plurality of lead fingers, the support having an exposed surface spanning the opening;

releasably attaching a back surface of a microelectronic device to the exposed surface of the support;

electrically coupling the microelectronic device to the lead frame;

delivering an encapsulant to a cavity defined by the support, the microelectronic device, and a peripheral dam carried by the lead frame, the encapsulant bonding the microelectronic device to the lead frame;

removing the support, leaving the back surface of the microelectronic device exposed; and cutting the lead frame to separate a plurality of electrically isolated lead fingers from the peripheral dam;

electrically coupling a first one of the microelectronic device assemblies to a substrate;

electrically coupling the lead fingers of a second one of the microelectronic device assemblies to the lead fingers of the first microelectronic device assembly with a back surface of the lead fingers of the second microelectronic device assembly being coupled to a front surface of the lead fingers of the first microelectronic device assembly, defining a gap between the exposed back surface of the microelectronic device of the second microelectronic device assembly and a front surface of the first microelectronic device assembly; and applying an electrically insulative covering over a front surface of the lead fingers of the second microelectronic device assembly.

2. The method of claim 1 wherein cutting the lead frame comprises cutting the lead frame within a periphery defined by the peripheral dam.

3. The method of claim 1 wherein assembling each microelectronic device assembly further comprises positioning an upper mold element against an upper surface of the lead frame prior to delivering the encapsulant.

4. The method of claim 1 wherein the upper mold element, the peripheral dam, and the exposed surface define a mold for the encapsulant.

5. The method of claim 3 wherein an upper surface of the encapsulant is aligned with the upper surface of the lead frame.

6. The method of claim 1 wherein electrically coupling the microelectronic device to the lead frame comprises coupling an active surface of the microelectronic device to the lead frame by a plurality of bond wires.

7. The method of claim 6 wherein an upper surface of the encapsulant is aligned with the upper surface of the lead frame and the bond wires are encapsulated in the encapsulant.

8. The method of claim 1 wherein removing the support exposes a lower surface of each of a plurality of lead fingers.

9. The method of claim 1 wherein removing the support exposes a lower surface of each of a plurality of lead fingers, the exposed lower surfaces being peripherally aligned.

10. The method of claim 1 wherein the lead frame includes a plurality of lead fingers extending inwardly from the peripheral dam, the encapsulant being permitted to flow between the support and at least some of the lead fingers.

11. The method of claim 1 wherein the gap is a first gap, the method further comprising filling a second gap between the first microelectronic device assembly and the substrate with an underfill material.

12. The method of claim 11 further comprising cooling the microelectronic device of the second microelectronic device assembly by exposing the back surface thereof to the intercomponent gap.

13. A method of assembling a microelectronic device assembly including a microelectronic die and a plurality of electrically independent lead fingers, comprising:

releasably attaching a support to a back surface of a lead frame and to a back surface of a microelectronic die, the lead frame including a front surface spaced from the back surface and an opening extending from the front surface to the back surface, the opening having an inner periphery defined by an outer member and a plurality of L-shaped lead fingers extending inwardly from the outer member, the die being positioned in the opening with a periphery of the die spaced inwardly of at least part of the inner periphery of the opening to define a first peripheral gap;

electrically coupling the die to the lead fingers with a plurality of bonding wires;

filling the opening above the support with an encapsulant, the encapsulant entering the peripheral gap and attaching the lead frame to the die;

removing excess encapsulant deposited on front surfaces of any of the lead fingers; and removing the support, leaving the back surface of the die exposed and leaving a back surface of each of the L-shaped lead fingers exposed, each lead finger thus having an exposed back surface that is larger than the front surface.

14. The method of claim 13 further comprising separating the lead fingers from the outer member.

15. The method of claim 13 further comprising cutting the outer member from the lead frame, yielding a plurality of independent lead fingers connected to one another only by the encapsulant and by the bonding wires via the die.

16. The method of claim 13 wherein the support comprises an adhesive tape, the lead frame and the die being releasably adhered to the adhesive tape and the adhesive tape forming a seal against the back surface of the lead frame and the back surface of the die to retain the first encapsulant.

17. The method of claim 13 further comprising cutting the lead frame to separate the lead fingers from the outer member.

18. The method of claim 13 wherein the support is a first support, the lead frame is a first lead frame, the microelectronic die is a first microelectronic die, the outer member is a first outer member, the lead fingers are first lead fingers, the bonding wires are first bonding wires, and the encapsulant is a first encapsulant, the method further comprising:

releasably attaching a second support to a back surface of a second lead frame and to a back surface of a second microelectronic die, the second lead frame including a front surface spaced from the back surface and an opening extending from the front surface to the back surface, the opening having an inner periphery defined by a second outer member and a plurality of second lead fingers extending inwardly from the second outer member, the second die being positioned in the opening with a periphery of the second die spaced inwardly of at least part of an inner periphery of the opening to define a second peripheral gap;

electrically coupling the second die to the second lead fingers with a plurality of second bonding wires;

filling the opening above the second support with a second encapsulant, the second encapsulant entering the second peripheral gap and attaching the second lead frame to the second die;

removing the second support, leaving the back surface of the second die exposed and leaving the back surface of the second lead frame exposed; and electrically coupling one of the first lead fingers to one of the second lead fingers.

19. The method of claim 18 wherein a plurality of the first lead fingers are electrically coupled to a plurality of the second lead fingers.

20. The method of claim 18 further comprising separating the first lead fingers from the first outer member and separating the second lead fingers from the second outer member.

21. The method of claim 20 wherein the first lead fingers are separated from the first outer member by cutting the lead frame prior to electrically coupling the first and second lead fingers.

22. The method of claim 20 wherein the first and second lead fingers are separated from the first and second outer members prior to electrically coupling the first and second lead fingers.

23. The method of claim 18 wherein electrically coupling the first and second lead fingers spaces the second die from the first encapsulant to define an intercomponent gap between the second die and the first encapsulant.

24. The method of claim 18 wherein the first lead finger is electrically coupled to the second lead finger by electrically coupling a front surface of the first lead finger to a back surface of the second lead finger.

25. A stacked microelectronic device assembly, comprising:

a first subassembly having a first thickness and comprising a plurality of electrically independent first lead fingers, a first die, and a first encapsulant bonding the first die to the first lead fingers, each of the first lead fingers having a thickness equal to the first thickness and defining an exposed front contact and an exposed back contact, the first die having an exposed back surface and being electrically coupled to the plurality of first lead fingers by a plurality of first bonding wires;

a second subassembly having a second thickness and comprising a plurality of electrically independent second lead fingers, a second die, and a second encapsulant bonding the second die to the second lead fingers, each of the second lead fingers having a thickness equal to the second thickness and defining a front contact and an exposed back contact, the second die having an exposed back surface and being electrically coupled to the plurality of second lead fingers by a plurality of second bonding wires;

a plurality of electrical connectors, each of which electrically couples the exposed front contact of one of the first lead fingers to the exposed back contact of one of the second lead fingers; and an electrically insulative covering over the exposed front contacts of the second lead fingers.

26. The stacked microelectronic device assembly of claim 25 wherein an intercomponent gap is defined between the first and second subassemblies.

27. The stacked microelectronic device assembly of claim 25 further comprising a substrate, the first subassembly being attached to a mounting surface of the substrate.

28. The stacked microelectronic device assembly of claim 25 wherein the exposed back contacts of at least two of the first lead fingers are electrically coupled to the substrate.

29. The method of claim 1 wherein removing the support exposes a lower surface of each of a plurality of lead fingers, the exposed lower surfaces of the lead fingers being staggered with respect to one another.

30. A method of assembling a microelectronic device assembly, comprising:

releasably attaching a back surface of a microelectronic device to a surface of a support;

thereafter, releasably attaching a lead frame to the support, the lead frame having a thickness and having an opening passing through the thickness, the microelectronic device being disposed in the opening and a portion of the surface of the support being exposed to the opening;

electrically coupling the microelectronic device to the lead frame;

delivering an encapsulant to a cavity defined by the support, the microelectronic device, and a peripheral dam carried by the lead frame, the encapsulant bonding the microelectronic device to the lead frame; and removing the support, leaving the back surface of the microelectronic device exposed.

31. The method of claim 30 wherein a plurality of microelectronic devices are releasably attached to the surface of the support and the lead frame has a plurality of the openings, releasably attaching the lead frame to the support comprising positioning one of the microelectronic devices in each of the openings.

* * * * *